(12) United States Patent
Lee (10) Patent No.: US 9,349,813 B2
(45) Date of Patent: May 24, 2016

(54) METHOD FOR FABRICATING SEMICONDUCTOR DEVICE

(75) Inventor: Sul Hwan Lee, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 850 days.

(21) Appl. No.: 13/330,057

(22) Filed: Dec. 19, 2011

(65) Prior Publication Data
US 2012/0220115 A1   Aug. 30, 2012

(30) Foreign Application Priority Data

Feb. 25, 2011   (KR) .................. 10-2011-0017091

(51) Int. Cl.
| | |
|---|---|
| *H01L 21/28* | (2006.01) |
| *H01L 29/423* | (2006.01) |
| *H01L 21/768* | (2006.01) |
| *H01L 29/66* | (2006.01) |

(52) U.S. Cl.
CPC ...... *H01L 29/4236* (2013.01); *H01L 21/76897* (2013.01); *H01L 29/66621* (2013.01)

(58) Field of Classification Search
None
See application file for complete search history.

(56) References Cited

U.S. PATENT DOCUMENTS

2006/0105538 A1*  5/2006  Pyi ................................ 438/396

FOREIGN PATENT DOCUMENTS

JP        2002-170953        6/2002

* cited by examiner

*Primary Examiner* — Seahvosh Nikimanesh
(74) *Attorney, Agent, or Firm* — IP & T Group LLP (57) ABSTRACT

A method for fabricating a semiconductor device includes forming at least two gate patterns on a substrate, forming sidewalls surrounding the gate patterns, wherein the sidewalls extend above an upper surface of the gate patterns, and forming a first conducting material in a first space and a second space, wherein the first space is provided above the gate patterns and between the sidewalls that extend above the upper surface of the gate patterns and the second space is provided between the gate patterns.

9 Claims, 15 Drawing Sheets

METHOD FOR FABRICATING SEMICONDUCTOR DEVICE

CROSS-REFERENCE(S) TO RELATED APPLICATIONS

The present application claims priority of Korean Patent Application No(s). 10-2011-0017091, filed on Feb. 25, 2011, which is incorporated herein by reference in its entirety.

BACKGROUND OF THE INVENTION

Exemplary embodiments of the present invention relate to method for fabricating a semiconductor device, and more particularly, to method for fabricating a MOS transistor and its neighboring patterns in a semiconductor device.

A circuit is first designed for implementing a designated function in a fabricating process of a semiconductor and subsequently, a lay-out drawing including a plurality of patterns and lines corresponding to the circuit is made.

An important issue in designing semiconductor technologies is the amount of semiconductor devices that may be implemented in one wafer. One semiconductor device fabricated in one wafer is called a die, and net dies signify how many dies are available in a wafer. Manufacturing cost can be reduced if net dies are increased in the wafer. Thus, designers try to reduce the size of the lay-out drawing. The size of transistors or lines in the lay-out drawing is typically implemented to the smallest sizes allowed by semiconductor technologies.

A MOS transistor in a semiconductor device includes a gate structure and a source/drain region neighboring the gate structure. The source or drain region electrically connects to a contact plug formed above the source or drain region. The gate structure comprises a dielectric layer and a conducting layer, which are stacked. The conducting layer typically includes a conducting silicon layer and a metal layer to raise the conducting layer's conductivity. Since each element of a MOS transistor is formed to the smallest size attainable, the contact plug on the source or drain region may be difficult to form. Considering a typical process of semiconductor technology, a dielectric layer is first formed on the gate structure and the source/drain region and subsequently, a contact hole is formed to expose the source/drain region by selectively etching the dielectric layer. A contact plug is formed to electrically connect with the source/drain region by filling the contact hole with a conducting material.

A design rule of semiconductor technology may be reduced. According to a design rule, fabricating the contact hole in the middle of a semiconductor fabricating process may be difficult. If the contact hole has a relatively wide thickness, a short may be formed between the gate structure and the contact. A short might cause the conducting layer of the gate structure to be easily exposed during a subsequent semiconductor fabrication process. If a sidewall between the gate structure and the contact plug has sufficient thickness, a process margin for making the contact hole may be very difficult to raise.

SUMMARY OF THE INVENTION

An embodiment of the present invention is directed to method for fabricating a semiconductor device where a process margin for implementing a transistor can be raised.

In accordance with an embodiment of the present invention, a method for fabricating a semiconductor device comprises: forming at least two gate patterns on a substrate; forming sidewalls surrounding the gate patterns, wherein the sidewalls extend above an upper surface of the gate patterns; and forming a first conducting material in a first space and a second space, wherein the first space is provided above the gate patterns and between the sidewalls that extend above the upper surface of the gate patterns and the second space is provided between the gate patterns.

In accordance with another embodiment of the present invention, a method for fabricating a semiconductor device comprises: forming a first layer on a substrate; forming a second layer on the first layer; patterning the first and second layer; forming a sidewall on the side of the patterned first layer and the patterned second layer; removing the patterned second layer formed on the patterned first layer; and filling a first conductive material in a first space and a second space formed by the patterned first layer and the sidewall, wherein the first space is provided above the patterned first layer and the second space is provided between the patterned first layers.

DESCRIPTION OF SPECIFIC EMBODIMENTS

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
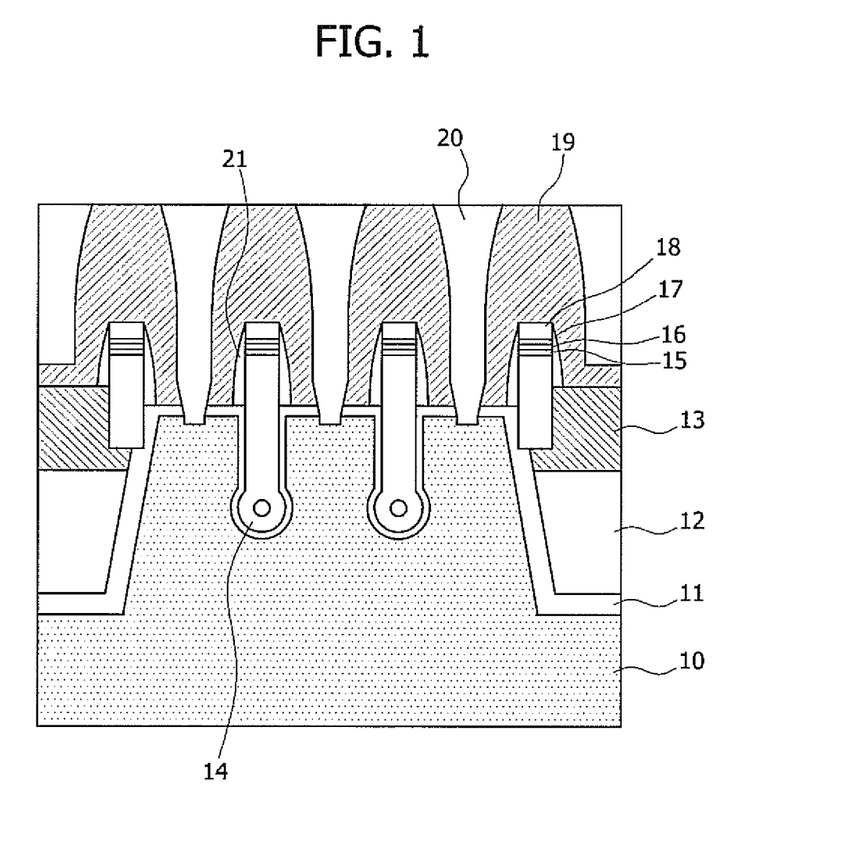
FIG. 1 is a sectional view illustrating a semiconductor device of the present invention.

FIG. 1 is a sectional view illustrating a semiconductor device of the present invention. More specifically, FIG. 1 illustrates a MOS transistor of the semiconductor device.

As shown, two dielectric layers 11 and 12 are positioned in a substrate 10. The dielectric layer 11 is positioned along the shape of the substrate 10, and the dielectric layer 12 is positioned on the area where the dielectric layer 11 serves as an isolation layer. A gate structure includes a polysilicon layer 14, metal layers 15, 16, and 17, and a hard masking layer 18. The gate structure also includes a gate sidewall 21 arranged on the sidewall of the polysilicon layer 14, the metal layers 15, 16, and 17, and the hard masking layer 18. A portion of the polysilicon layer 14 is formed in the substrate 10. The dielectric layer 11 is arranged under the polysilicon layer 14. A source region and a drain region may be arranged at both side of the gate structure. Here, the source region or the drain region is omitted. A contact plug 20 is connected to the source region or the drain region through an insulating layer 19.

Considering the manufacturing process of the semiconductor device in FIG. 1, a recess process is first implemented in a designated area of the substrate 10 for a gate structure of a MOS transistor. The dielectric layer 11 is formed along an upper surface of the substrate having a recess space. The polysilicon layer 14 is formed at the bottom of the recess space to a designated height and subsequently, the metal layers 15, 16, and 17 are formed on the polysilicon layer 14. Together with the polysilicon layer 14, the metal layers 15, 16, and 17 and the polysilicon layer 14 form gate patterns. The gate sidewall 21 is formed on a sidewall surface of the gate patterns. The source region and the drain region are formed at both sides of the gate structure.

The insulating layer 19 is formed over the gate structure. Contact holes are formed to expose the source region and the drain region by selectively etching the insulating layer 19. A contact plug 20 is formed to electrically connect the source or drain region to a line by filling the contact hole with a conducting material.

The sidewall 21 insulates the polysilicon layer 14 of the gate structure from the contact plug 20. The thickness of the sidewall 21 depends on the insulation characteristics of the gate structure. Since an area for a MOS transistor is limited, increasing the thickness of the sidewall 21 causes the thickness of the contact plug 20 to be reduced. Additionally, as the thickness of the contact plug 20 increases, the thickness of the sidewall 21 may decrease.

The contact plug 20 generally connects the drain region with a bit line. If the contact plug 20 does not have a sufficient thickness, the bit line and the drain region may not have sufficient electric conductivity. The insufficient electric conductivity may result in a reduction in a characteristic of a semiconductor device, for example a write recovery characteristic 'tWR'. Additionally, if a designated width for the contact plug 20 is insufficient, the contact hole for the contact plug 20 may be difficult to manufacture, especially in terms of process alignment margin. Alternatively, if a sufficient thickness of the contact plugs 20 is formed, the thickness of the sidewall 21 may be insufficient. As a result, a conductive layer of the gate structure may be connected to the contact plug 20.

To address the issues described above, a method for fabricating a semiconductor device in accordance with an embodiment of the present invention includes a gate pattern, a bit line, and a contact plug that can be substantially formed with one process step.

Figure 2:
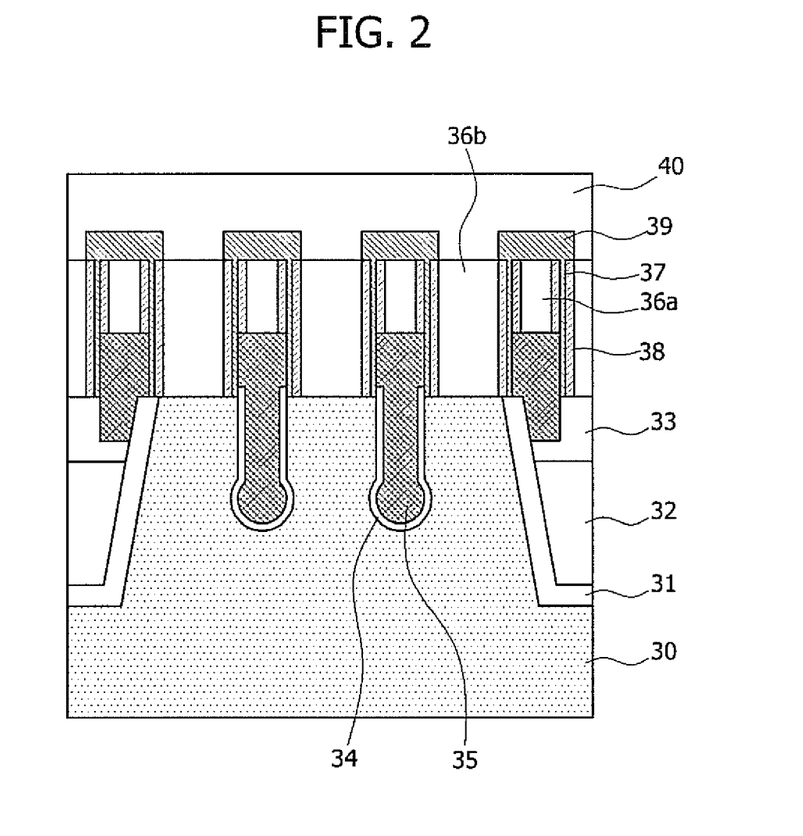
FIG. 2 is a sectional view illustrating a semiconductor device fabricated in accordance with an embodiment of the present invention.

FIG. 2 is a sectional view illustrating a semiconductor device fabricated in accordance with an embodiment of the present invention.

As shown, isolation layers 31, 32 and 33 are arranged in the substrate 30. A gate structure includes gate patterns 34, 35, 36a, 37, 38, 39. A contact plug 36b is arranged between the gate structures, and an insulation layer 40 is arranged above the contact plug 36b and the gate structure.

FIGS. 3A to 3M are a sectional view illustrating a method for fabricating a semiconductor device in accordance with an embodiment of the present invention.

Figure 3A:
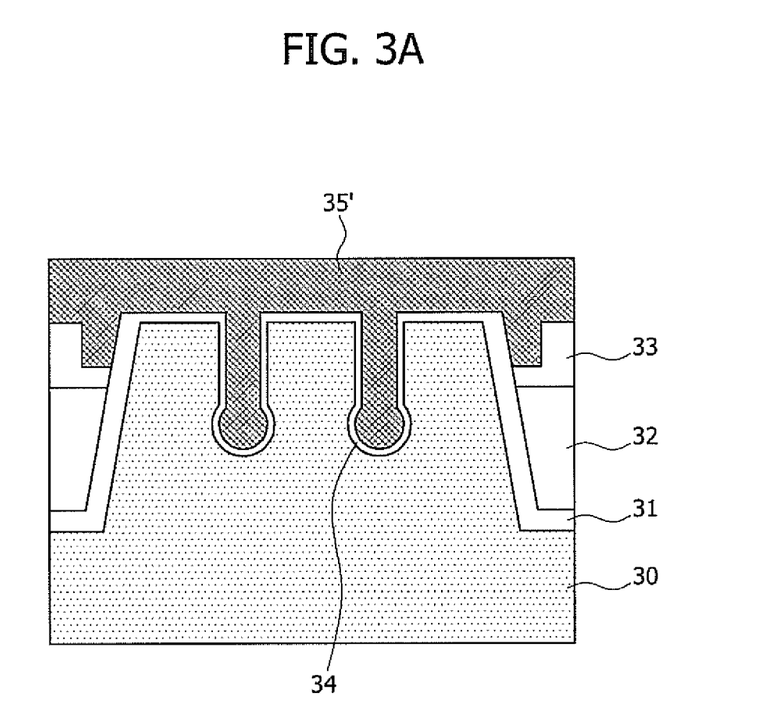
FIGS. 3A to 3M are a sectional view illustrating a method for fabricating a semiconductor device in accordance with an embodiment of the present invention.

Referring to FIG. 3A, a first trench T1 and a second trench T2 are formed in the substrate 30. The first trench T1 is divides the substrate into isolation areas and active areas, and the second trench T2 provides a recess area of a gate structure. An insulating layer 31 is formed along the face of the substrate 30 including the first and second trenches T1 and T2. An isolation layer 32 and 33 are formed in the first trench. For example, the isolation layer 32 might be a silicon oxide layer and the isolation 33 might be a silicon nitride layer. A conducting layer 35' is formed over the entire surface of the substrate 30, in the second trench T2, and over the isolation layer 33 in the first trench T1. In this process, the second trench of a gate structure is filled with the conducting layer 35'. For example, the conducting layer 35' may be a polysilicon layer.

Figure 3B:
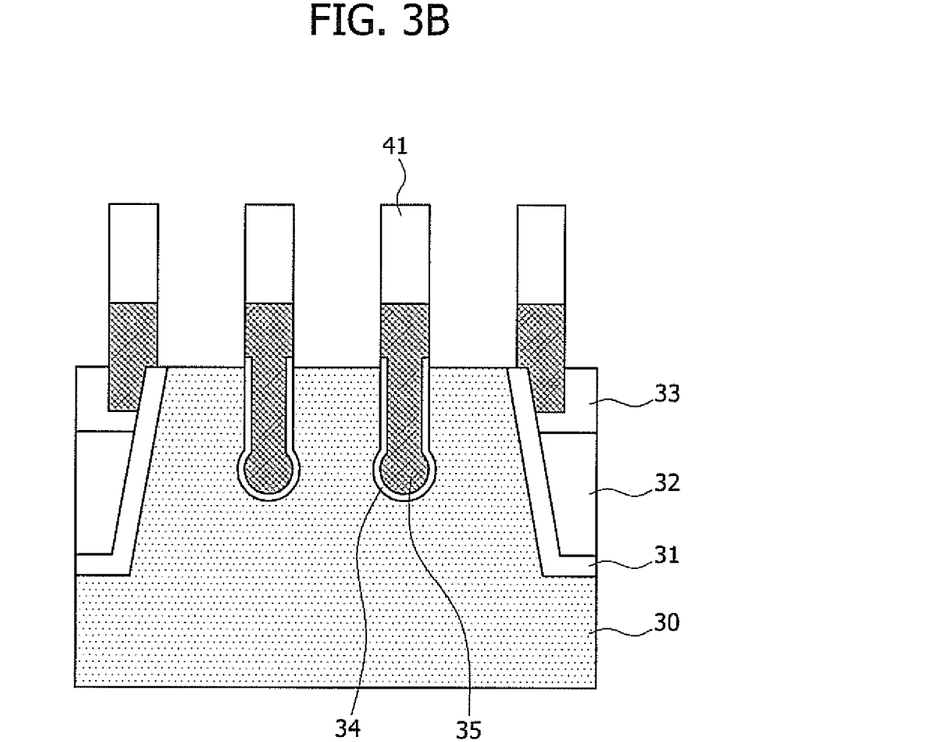

Referring to FIG. 3B, a silicon oxide pattern 41 is formed on the conducting layer 35'. A first gate electrode pattern 35 is formed after the conducting layer 35' is etched using the silicon oxide pattern 41 as an etching mask. When the conducting layer 35' is etched, a part of the insulating layer 31 arranged on the active area of the substrate 30 is removed to expose the active area of the substrate 30, i.e., source/drain area.

Figure 3C:
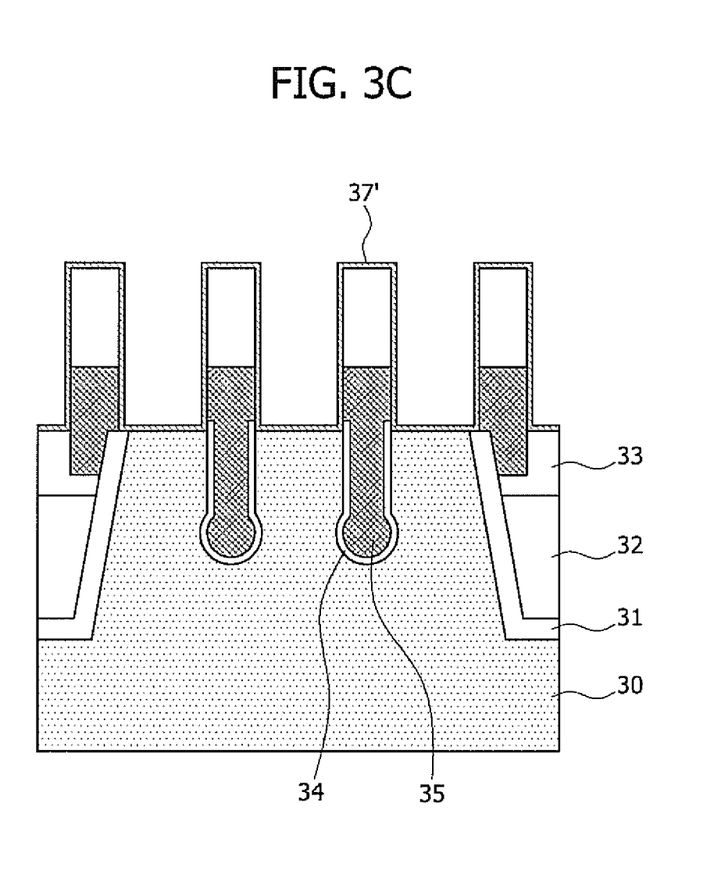

Referring to FIG. 3C, a silicon nitride layer 37' is formed along the first gate electrode pattern 35 and the silicon oxide pattern 41.

Figure 3D:
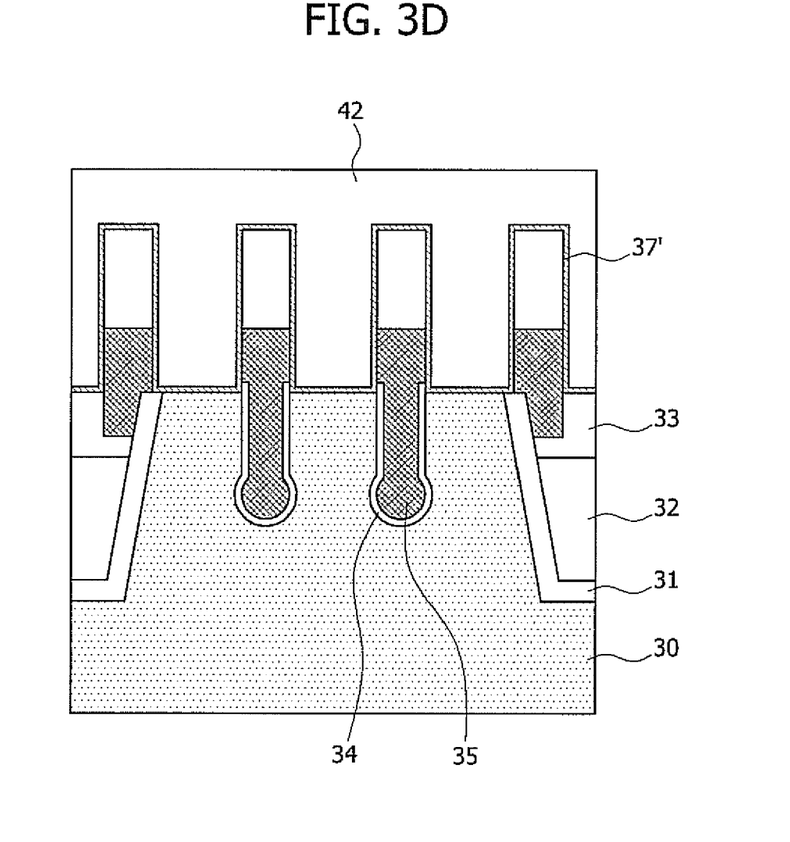

Referring to FIG. 3D, a silicon oxide layer 42 is formed above the silicon nitride layer 37'.

Figure 3E:
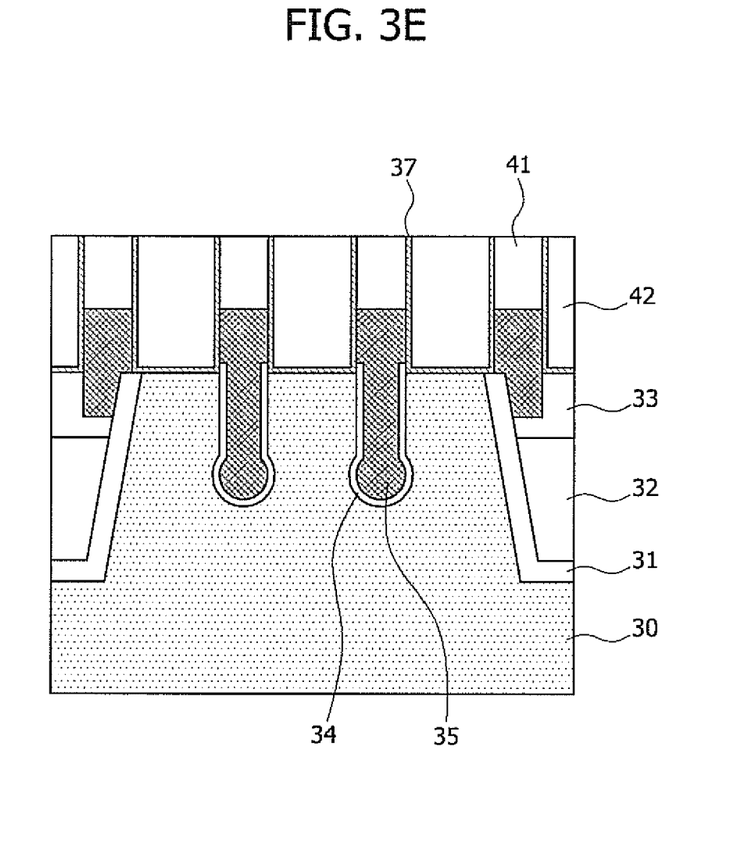

Referring to FIG. 3E, a chemical and mechanical polishing process for removing a portion of the silicon oxide layer 42 is implemented to expose the silicon oxide pattern 41. This process is implemented so that the first sidewall pattern 37 may serve as the sidewall of the gate structure.

Figure 3F:
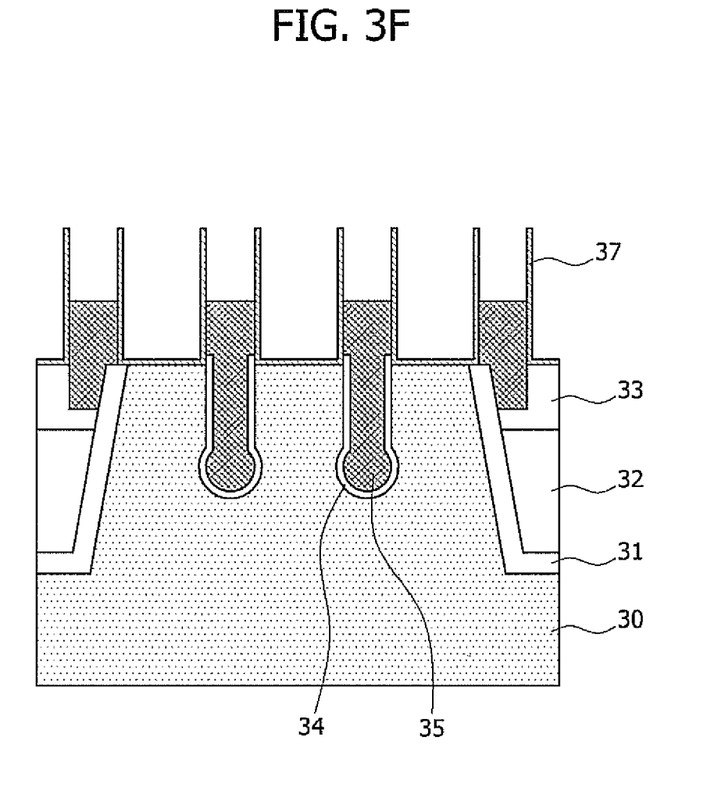

Referring to FIG. 3F, the silicon oxide pattern 41 is removed by a full dip out process. The full dip out process may include a wet etching process. As a result, the first sidewall pattern 37 remains surrounding the first gate electrode pattern 35. Additionally, as the silicon oxide pattern 41 is removed, space surrounded by the sidewall pattern 37 above the first gate electrode pattern 35 is formed.

Figure 3G:
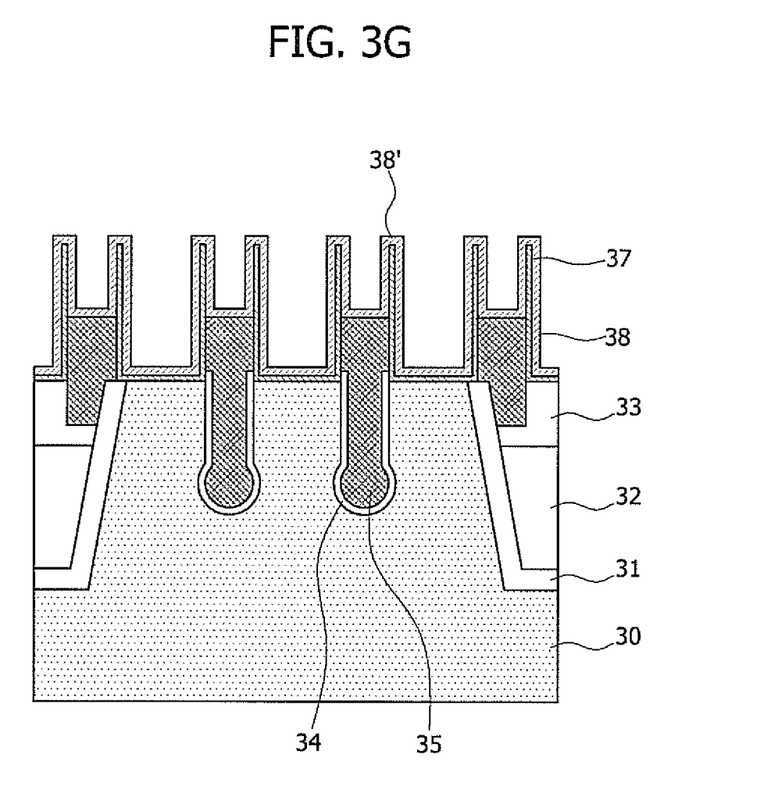

Referring to FIG. 3G, a silicon nitride layer 38' is formed on the faces and upper surfaces of the first sidewall pattern 37 using atomic layer deposition processes. This process can make the sidewall of the gate structure thicker.

Figure 3H:
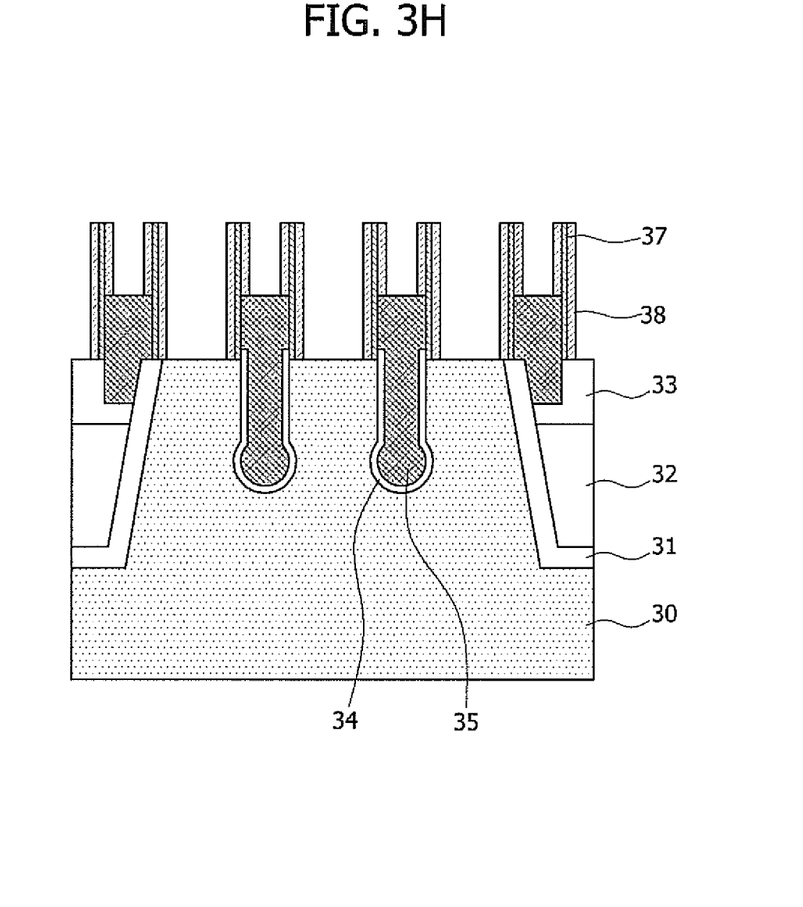

Referring to FIG. 3H, an etch back process is performed to remove a portion of the silicon nitride layer 38' and a portion the sidewall pattern 37 arranged on the source/drain area of the substrate 30. Thus, the source/drain area of the substrate 30 is exposed by the etch back process, and the second sidewall pattern 38 is formed.

Figure 3I:
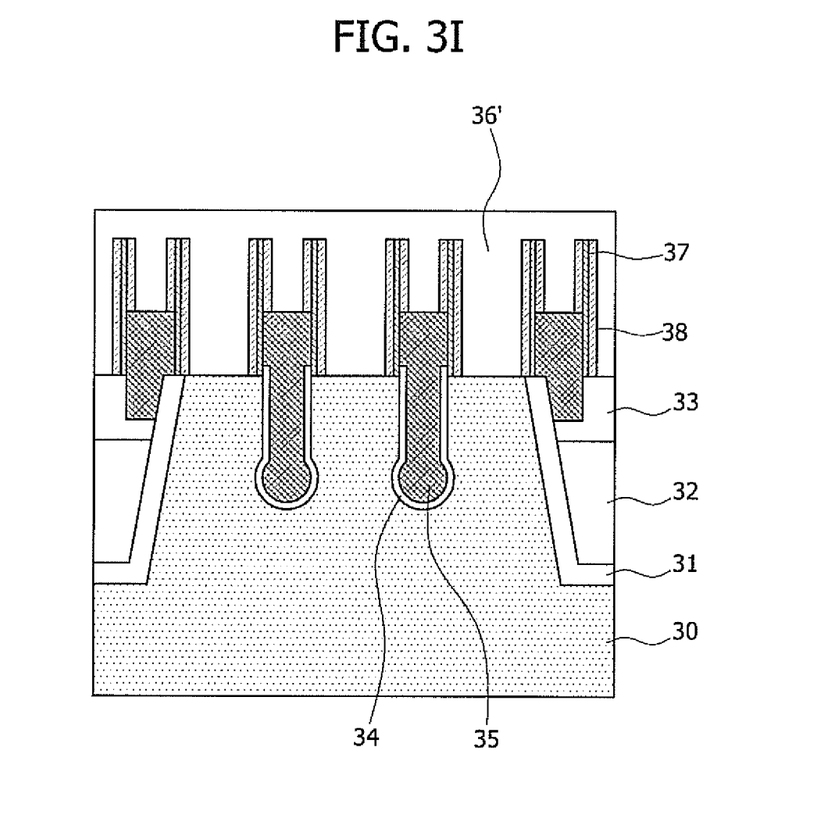

Referring to FIG. 3I, a metal layer 36' is formed above the sidewall patterns 37 and 38, and the first gate electrode pattern 35. The metal layer 36' may include tungsten.

Figure 3J:
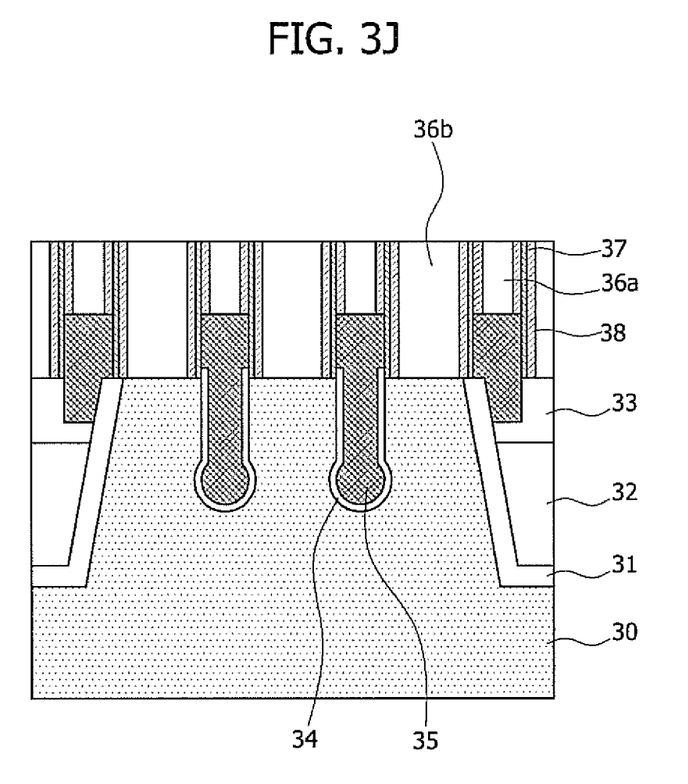

Referring to FIG. 3J, a chemical mechanical polishing (CMP) process is implemented to expose the sidewall patterns 37 and 38. This CMP process forms a metal pattern 36a for the gate structure and a contact plug 36b neighboring the gate structure at the same time.

The gate structure typically includes a metal pattern stacked on a polysilicon pattern to enhance the conductivity of its conducting pattern. As described above, the metal pattern 36a and the contact plug 36b can be substantially formed at the same time.

Figure 3K:
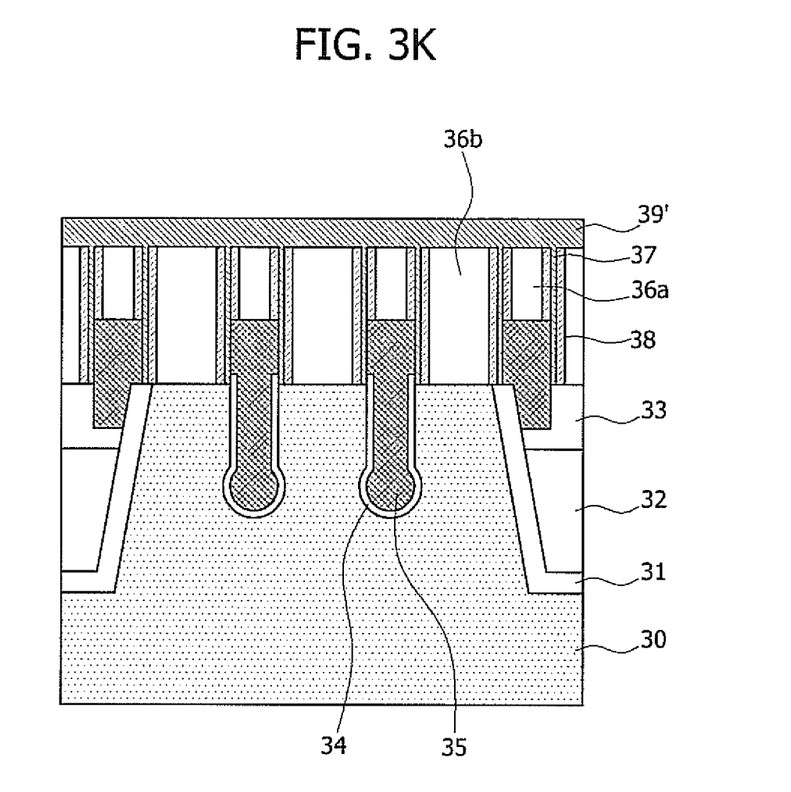

Referring to FIG. 3K, a nitride layer 39' is formed on the contact plug 36b and the gate structure.

Figure 3L:
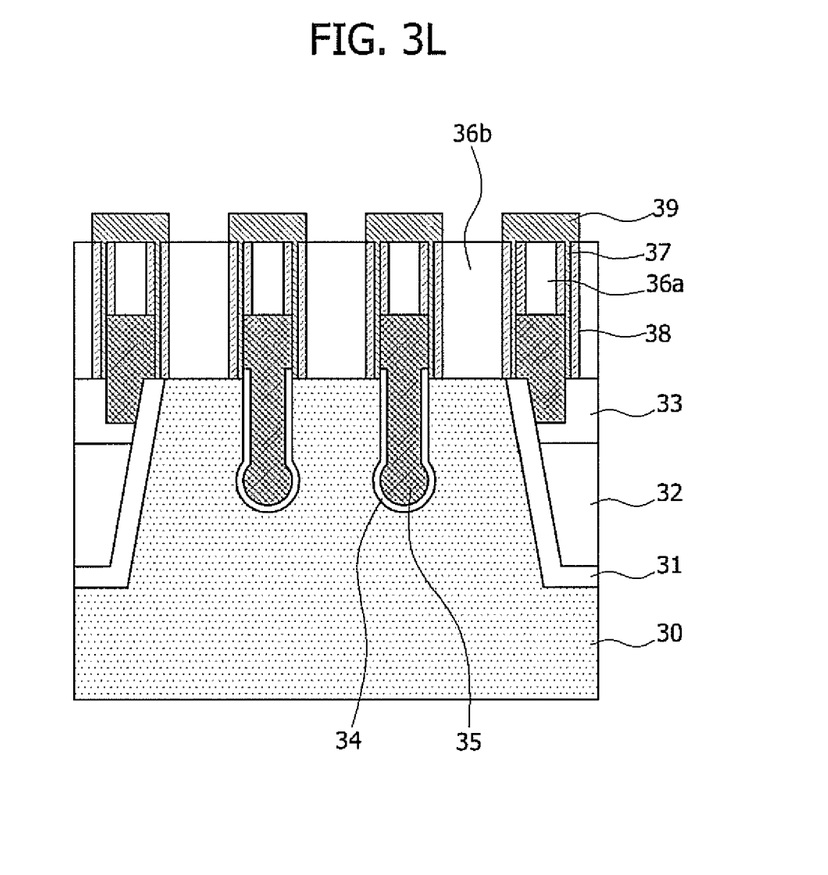

Referring to FIG. 3L, the nitride layer 39' is patterned to form a nitride pattern 39. The nitride pattern 39 is arranged above the metal pattern 36a and the sidewall patterns 37 and 38 and insulates the contact plug 36b from the metal pattern 36a of the gate structure.

Figure 3M:
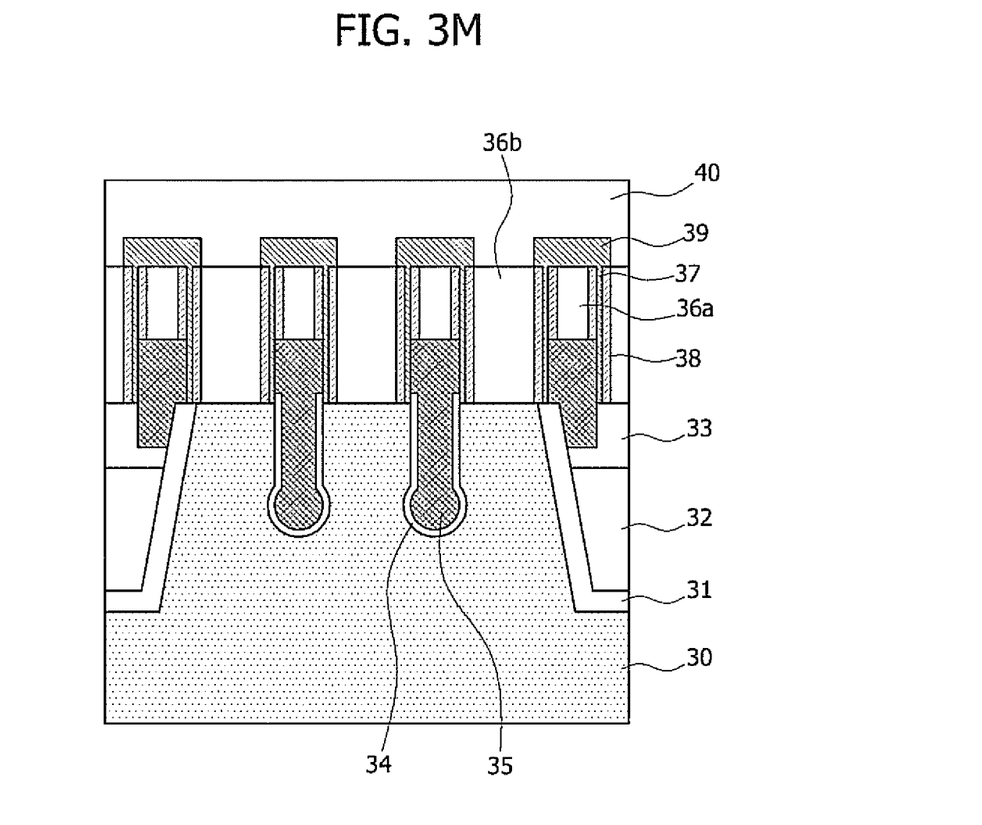

Referring to FIG. 3M, an oxide layer 40 is formed on the nitride pattern 39.

As described above, the metal pattern 36a and the contact plug 36b can be formed at the same time according to the embodiment. More specifically, a conductive pattern of the gate structure and a contact plug electrically connected to a source/drain region neighboring the gate structure is implemented by one process, i.e., the full dip out process (referring to FIG. 3F). Thus, the embodiments address the trade-off issues regarding the process margin of the contact plug and the sidewall width of the gate structure.

A side pattern is arranged on the sidewall of the gate structure and metal is filled in both spaces formed by the side pattern through a process. In the embodiment, the process includes the full dip out process and the CMP process. By the process, a contact plug and a metal pattern of a gate structure are simultaneously formed.

While a process margin of the contact plug remains high, the electrical shorting between the contract plug and the metal pattern of the gate structure can be addressed. If a semiconductor memory device is manufactured using a semiconductor process according to the present invention, the electrical characteristics, such as tWR, for the contract plug can be enhanced.

As semiconductor devices may include highly integrated circuits, process margins for patterns in a MOS transistor are to be reduced. The process margins between active area and a gate pattern is to be reduced. If misalignment occurs in a process for a landing plug with misalignment between an active area and a gate pattern, fabricating reliable MOS transistors in a semiconductor device may be difficult.

Since the manufacturing method in the embodiment does not have a process of a landing plug, a reliable semiconductor device may be fabricated. Additionally, the manufacturing method in the embodiment has an effective process margin for fabricating MOS transistors in a semiconductor device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming at least two gate patterns over a substrate;
    forming spacers over both sidewalls of each of the gate patterns, wherein the spacers extend above an upper surface of each of the gate patterns; and
    forming a conducting material in a first space and a second space, wherein the first space is provided over each of the gate patterns and between the spacers and the second space is provided between the gate patterns,
    wherein the conducting material in the first space is isolated from the conducting material in the second space.

2. The method according to claim 1, wherein the conducting material formed over each of the gate patterns is electrically coupled to each of the gate pattern, respectively.

3. The method according to claim 1, wherein a part of each of the gate patterns is buried in the substrate.

4. The method according to claim 1, wherein the forming of the gate patterns includes:
    forming a first conducting material over the substrate;
    forming hard mask patterns over the first conducting material; and
    etching the first conducting material to form the gate patterns using the hard mask patterns as an etch mask.

5. The method according to claim 4, wherein the forming of the spacers includes:
    forming a first dielectric layer over sidewall surfaces of the hard mask patterns and the gate patterns and over upper surfaces of the hard mask patterns and the substrate;
    forming a second dielectric layer over the first dielectric layer;
    removing a portion of the first and second dielectric layers to expose the hard mask patterns; and
    removing the hard masking patterns and the second dielectric layer using a full dip out process.

6. The method according to claim 1, wherein each of the gate patterns includes a polysilicon layer and the conducting material includes a metal.

7. The method according to claim 1, wherein the filling of the first conducting material in the first space and the second space includes a chemical mechanical polishing process.

8. The method according to claim 1, wherein the spacers include a nitride layer.

9. The method according to claim 5, further comprising performing an atomic layer deposition process to increase a thickness of the first dielectric layer after removing the hard mask patterns and the second dielectric layer.

* * * * *